(12) United States Patent
Eldridge et al.

(10) Patent No.: US 7,010,854 B2
(45) Date of Patent: Mar. 14, 2006

(54) RE-ASSEMBLY PROCESS FOR MEMS STRUCTURES

(75) Inventors: Benjamin N. Eldridge, Danville, CA (US); Gaetan L. Mathieu, Livermore, CA (US)

(73) Assignee: FormFactor, Inc., Livermore, CA (US)

( * ) Notice: Subject to any disclaimer, the term of this patent is extended or adjusted under 35 U.S.C. 154(b) by 311 days.

(21) Appl. No.: 10/119,963

(22) Filed: Apr. 10, 2002

(65) Prior Publication Data

US 2003/0192176 A1 Oct. 16, 2003

(51) Int. Cl.
*H05K 3/30* (2006.01)

(52) U.S. Cl. .......................... 29/832; 29/842; 29/844; 324/762; 324/754; 438/462; 438/464

(58) Field of Classification Search .................. 29/412, 29/417, 464–467, 593, 830, 832, 842; 174/260, 174/267; 361/760, 764, 784, 791; 438/401, 438/460, 462, 464; 324/754, 762
See application file for complete search history.

(56) References Cited

U.S. PATENT DOCUMENTS

| | | | |
|---|---|---|---|
| 5,476,211 A | 12/1995 | Khandros | |
| 5,806,181 A | 9/1998 | Khandros et al. | |
| 5,917,707 A | 6/1999 | Khandros et al. | |
| 5,974,662 A | 11/1999 | Eldridge et al. | |
| 6,064,213 A * | 5/2000 | Khandros et al. | ........... 324/754 |
| 6,110,823 A | 8/2000 | Eldridge et al. | |
| 6,150,186 A | 11/2000 | Chen et al. | |
| 6,255,126 B1 | 7/2001 | Mathieu et al. | |
| 6,268,015 B1 | 7/2001 | Mathieu et al. | |
| 6,336,269 B1 | 1/2002 | Eldridge et al. | |
| 6,441,315 B1 | 8/2002 | Eldridge et al. | |
| 6,627,483 B1 * | 9/2003 | Ondricek et al. | ........... 438/117 |
| 6,713,374 B1 | 3/2004 | Eldridge et al. | |
| 2001/0001080 A1 | 5/2001 | Eldridge et al. | |
| 2001/0012739 A1 | 8/2001 | Grube et al. | |
| 2002/0019152 A1 | 2/2002 | Eldridge et al. | |
| 2002/0025603 A1 | 2/2002 | Ondricek et al. | |
| 2003/0199179 A1 | 10/2003 | Dozier, II et al. | |

FOREIGN PATENT DOCUMENTS

| | | |
|---|---|---|
| WO | WO 97/43653 | 11/1997 |
| WO | WO 97/44676 | 11/1997 |
| WO | WO 00/28625 | 5/2000 |
| WO | WO 00/75677 | 12/2000 |
| WO | WO 01/09952 | 2/2001 |
| WO | WO 02/063682 | 8/2002 |

OTHER PUBLICATIONS

U.S. Appl. No. 09/710,539, filed Nov. 9, 2000, Eldridge et al.

* cited by examiner

*Primary Examiner*—Minh Trinh
*Assistant Examiner*—Donghai D. Nguyen
(74) *Attorney, Agent, or Firm*—N. Kenneth Burraston (57) ABSTRACT

Methods of fabricating an array of aligned microstructures on a substrate are disclosed. The microstructures may be spring contacts or other microelements. The methods disclosed include construction of an alignment substrate, alignment of die elements with the alignment substrate, and fixation of the aligned die elements to a backing substrate.

29 Claims, 10 Drawing Sheets

RE-ASSEMBLY PROCESS FOR MEMS STRUCTURES

BACKGROUND OF THE INVENTION

The present invention relates generally to a method of fabricating an array of microstructures.

An example of microstructures is a spring contact. An array of spring contacts may be used as probes in probe card assemblies (among other uses). Examples of spring contacts are disclosed in U.S. application Ser. No. 08/802,054 filed Feb. 18, 1997, and examples of probe card assemblies are disclosed in U.S. Pat. No. 5,974,662, both of which are incorporated by reference herein.

Fabricating a structure comprising an array of microstructures, such as spring contacts, can be difficult. For example, if all of the microstructures are fabricated on a single substrate that is to be their final support substrate in the overall structure being made, a defect in one microstructure may cause the entire array to be discarded. On the other hand, if the microstructures are not fabricated on their final support substrate, it may be difficult to align all of the microstructures with respect to one another.

SUMMARY OF THE INVENTION

The invention is set forth in the claims below, and the following is not in any way to limit, define or otherwise establish the scope of legal protection. In general terms, the present invention relates to a method of fabricating an array of microstructures by aligning and assembling smaller elements into a single structure.

Further objects, embodiments, forms, benefits, aspects, features and advantages of the present invention may be obtained from the present disclosure.

DETAILED DESCRIPTION OF THE INVENTION

For the purposes of promoting an understanding of the principles of the invention, reference will now be made to the embodiments illustrated in the drawings and specific language will be used to describe the same. It will nevertheless be understood that no limitation of the scope of the invention is thereby intended, and alterations and modifications in the illustrated device and method and further applications of the principles of the invention as illustrated therein, are herein contemplated as would normally occur to one skilled in the art to which the invention relates.

Figure 1:
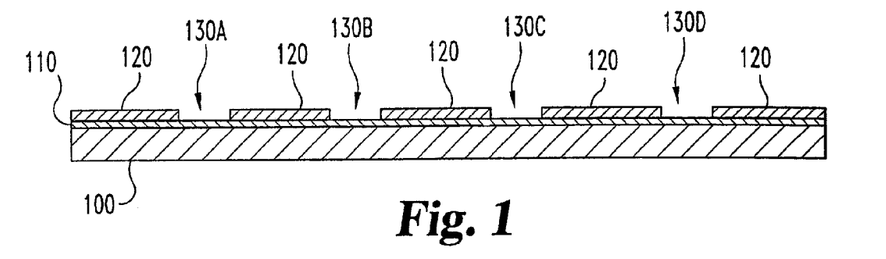
FIG. 1 is a cross-sectional view illustrating an initial step in a process showing an exemplary embodiment of the present invention.
Figure 2:
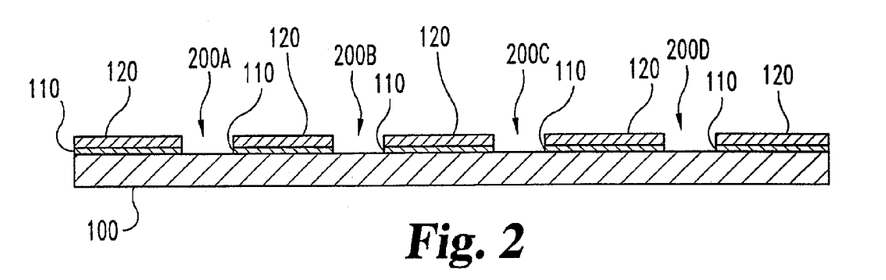
FIG. 2 is a cross-sectional view of a further step in the exemplary process of FIG. 1.
Figure 3:
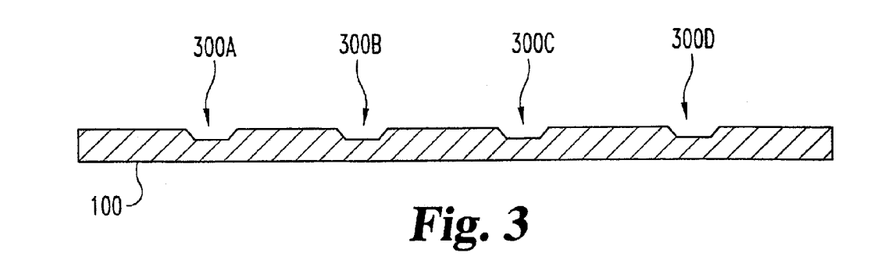
FIG. 3 is a cross-sectional view of a further step in the exemplary process of FIG. 1.

FIGS. 1–3 illustrate a technique for fabricating alignment structures on substrate, which may be a silicon wafer. The alignment structures are shown as pits, but other types of alignment structures such as groves or holes are also contemplated. FIGS. 1–3 also illustrate a technique for fabricating alignment structures on a master substrate, which may also be a silicon wafer. A master substrate will be discussed in greater detail later in this disclosure.

As seen in FIG. 1, a substrate 100 having a top surface (as viewed) is used as a substrate for constructing the desired microstructures. On the top surface of the substrate 100 is an oxide layer 110. A layer of a masking material 120 (e.g., photoresist) is deposited atop the oxide layer 110. The masking layer 120 is processed in any suitable manner to have a plurality (four shown, although more or fewer are also contemplated) of pits 130A–D extending through the masking material to the underlying oxide layer 110. The substrate 100 is then prepared for removal of the oxide layer 110.

FIG. 2 shows the substrate 100 after removal of the oxide layer 110. This may be accomplished such as by etching the surface of the substrate 100 with hydrofluoric acid (HF) or by other suitable means. The masking layer 120 shields the oxide layer 110 from the etching process creating etched guide pits 200A–D which pass through the masking layer 120 and the oxide layer 110 to the surface of the substrate 100. The substrate 100 is now prepared for creation of guide pits 300A–D in the surface of the substrate 100.

FIG. 3 shows a substrate 100 having a plurality (four shown, although more or fewer are also contemplated) guide pits 300A–D on its upper surface (as shown). Prior to creation of the guide pits 300A–D, the masking layer 120 is removed from the oxide layer 110 as seen in FIG. 2 by any suitable means. This leaves a substrate 100 having an oxide layer 110 with a plurality of holes 200A–D passing through the oxide layer. Once the masking layer 120 is removed from the substrate 100 of FIG. 2, the substrate 100 may be etched to create guide pits 300A–D in the surface of the substrate 100. This may be accomplished by etching the pits 300A–D with potassium hydroxide (KOH) or other suitable means. Indeed, various etching techniques are known in the field, and an etching technique may be selected to achieve a particular etch. For example, a deep reactive ion etch may be selected to achieve pits with approximately vertical sidewalls. Once the guide pits 300A–D have been etched into the surface of the substrate 100, the oxide layer 110 may optionally be removed leaving the substrate 100 as seen in FIG. 3. Removal of the oxide layer 110 may be accomplished by stripping with HF or other suitable means.

Figure 4:
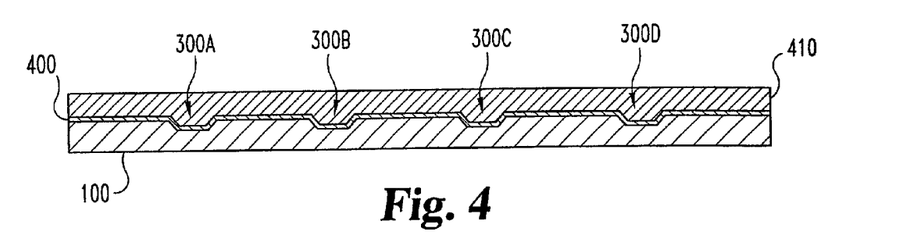
FIG. 4 is a cross-sectional view of a further step in the exemplary process of FIG. 1.

Once guide pits 300A–D have been etched into the surface of the substrate 100, a layer or layers of metal film 400 may be deposited onto the surface of the substrate 100. Although only a single metal layer 400 is shown in FIG. 4, this for the sake of clarity and is in no way intended to limit the scope of the present invention. The metal layer 400 may be deposited in any suitable method such as by sputtering or plating. The exact composition, thickness, and number of metal layers deposited will vary according to the ultimate structure desired. Typical examples of metals deposited include aluminum, copper, nickel, and titanium. Other metals and non-metal layers may also be deposited on the surface of the substrate 100 at this point in the process. Once any desired metal layers 400 have been deposited, a layer of a suitable masking material 410 is deposited over the metal layer 400 (if any) on the surface of the substrate 100.

Figure 5:
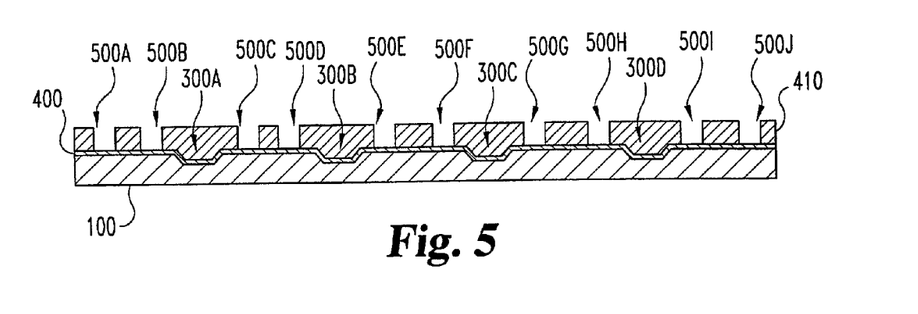
FIG. 5 is a cross-sectional view of a further step in the exemplary process of FIG. 1.

FIG. 5 shows a substrate 100 having a plurality (ten shown, although more or fewer are also contemplated) of features 500A–J developed on its surface through the masking layer 410. Such features 500A–J may be processed by any suitable method. For example, masking layer 410 may be made of a photosensitive material, and features 500A–J formed by exposing portions of the masking layer 410 to light. The exact number, size, shape, and alignment of these features 500A–J is determined by the type of microstructure desired. The number and arrangement of features 500A–J shown in FIG. 5 and the corresponding features 600A–J shown in FIGS. 6–12 are for illustrative purposes only and in no way are intended to limit the scope of the present invention.

Figure 6:
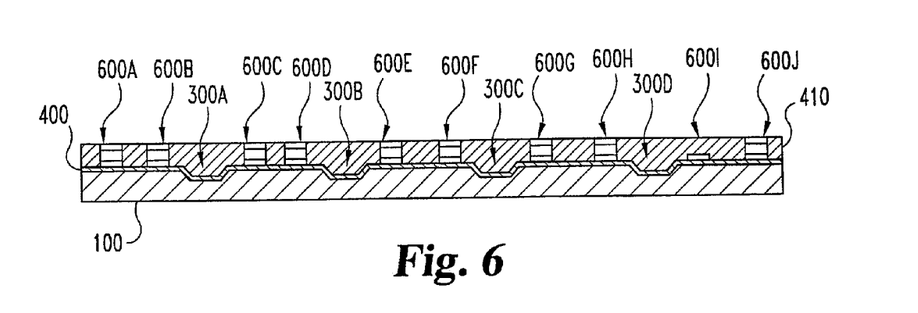
FIG. 6 is a cross-sectional view of a further step in the exemplary process of FIG. 1.
Figure 7:
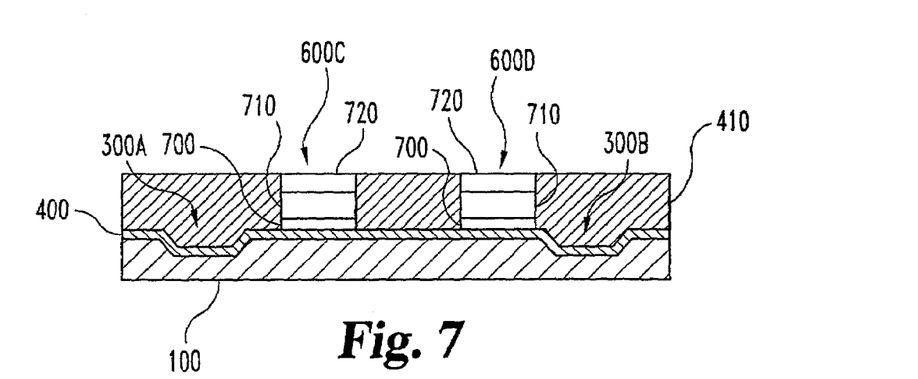
FIG. 7 is an enlarged cross-sectional view of a portion of FIG. 6.

FIG. 6 shows the desired features 600A–J constructed in the features 500A–J on the surface of the substrate 100. FIG. 7 is an enlargement of a portion of FIG. 6 showing greater detail of the microstructure features 600A–J. The microstructure features 600C–D shown in FIG. 7 consist of three layers 700, 710, 720. These layers 700, 710, 720 may be comprised of suitable metals or nonmetals depending upon the desired microstructure features 600A–J to be constructed. The present invention also contemplates the fabrication of microstructure features 600A–J having greater or fewer layers than those shown in FIG. 7. These steps show building up from the substrate 100. The substrate 100 may be a semiconductor and circuit elements and wiring may be formed on the substrate 100 as in conventional semiconductor fabrication. It is also possible that devices could be built down into the substrate 100, including transistors or other components, prior to or after the generation of the alignment structures 300.

Figure 8:
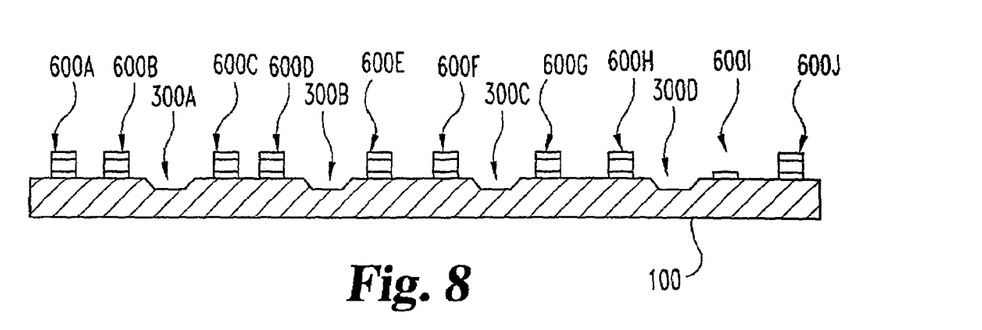
FIG. 8 is a cross-sectional view of a further step in the exemplary process of FIG. 1.

FIG. 8 shows a substrate having a plurality of microstructure features 600A–J (ten shown, although more or fewer are also contemplated) and a plurality of guide pits 300A–D (four shown, although more or fewer are also contemplated) after removal of the masking layer 410 and metal film layer 400 of FIG. 6. Removal of the masking layer 410 may be accomplished by any suitable means such as stripping. Optionally, the metal layer 400 may then be removed by a suitable method such as etching. The exact means used to remove the masking layer 410 and the metal layer 400 will vary according to their composition and the composition of the microstructure features 600A–J constructed on the surface of the substrate 100.

For illustrative purposes, FIG. 8 also shows a defective microstructure feature 600I. Defective features may occur during the fabrication of microstructure features for a variety of reasons that vary according to the type of structures being fabricated and their composition. Indeed, although the defective microstructure illustrated in FIG. 8 has a visible physical defect, the defect may other than physical or visible. As just one example, the microstructure is an electrical connection element, the element may be defective because it was determined that its electrical properties fail to meet a predetermined specification after electrically testing the microstructure. For the purposes of this disclosure, it is only important to note that the defective microstructure feature 600I is undesirable and must be removed before fabrication of the final substrate.

Figure 9:
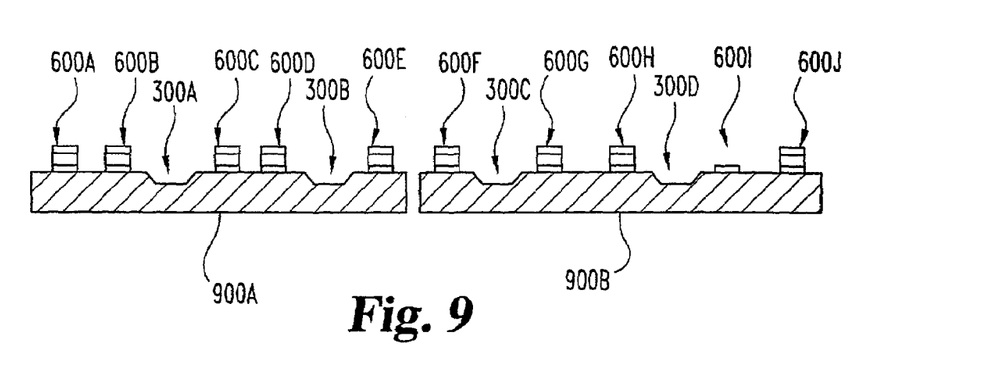
FIG. 9 is a cross-sectional view of a further step in the exemplary process of FIG. 1.

Removal of defective microstructure feature 600I is accomplished by first separating the substrate 100 into individual dice elements 900A—B as seen in FIG. 9. Separation of the substrate 100 may be accomplished by sawing or any other suitable method. Once the substrate 100 has been separated, dice 900B containing defective microstructure features (such as 600I) may be discarded and replaced with non-defective dice. These replacement dice may be taken from another part of the substrate or manufactured separately as desired.

Figure 10:
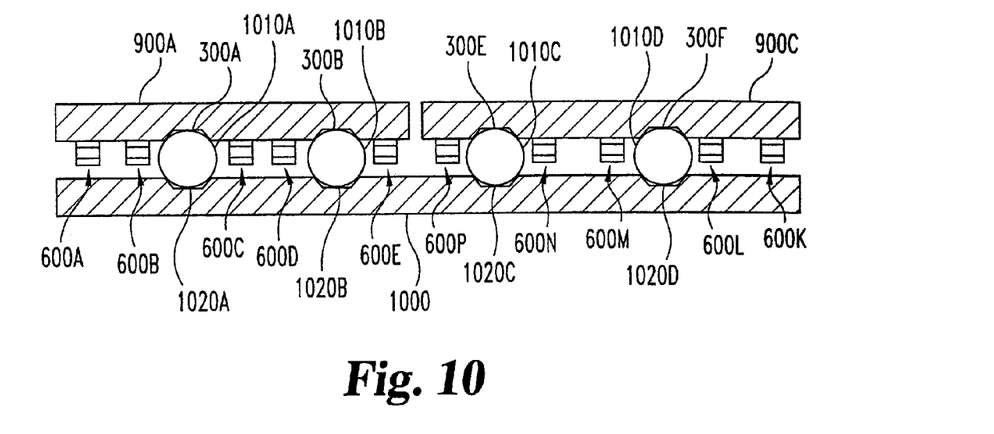
FIG. 10 is a partially cross-sectional view of a further step in exemplary process of FIG. 1.

Once defective dice 900B have been replaced, assembly of the final substrate may begin. FIG. 10 shows a partial cross sectional view of a partially reassembled substrate. A master substrate 1000 is formed by the process previously described in the discussion of FIGS. 1–3 having a plurality of guide pits 1020A–D (four shown, although more or fewer are also contemplated) corresponding to the plurality of guide pits 300A–D (four shown, although more or fewer are also contemplated) on the individual dice 900A, C. Alignment spheres 1010A–D, which are known in the industry, are placed in the guide pits 1020A–D of the master substrate 1000. The spheres may be made of metal, ceramic, or any other suitable material. The individual dice elements 900A, C are placed such that the guide pits 300 A–B, E–F engage the alignment sphere 1010A–D of the corresponding guide pit 1020A–D on the master substrate 1000. This ensures that the individual microstructure features 600A–E, K–P of each die 900A, C properly aligned relative to the microstructure features on the other dice in the X-axis (horizontal as shown), Y-axis (into the page as shown) and Z-axis (vertical as shown) directions. Of course, the more uniform the alignment spheres are with respect to each other, the more precise the alignment of the dice the resulting array of microstructures. Alignment spheres of varying degrees of uniformity are known in the field and may be selected to meet the particular needs at hand.

Figure 11:
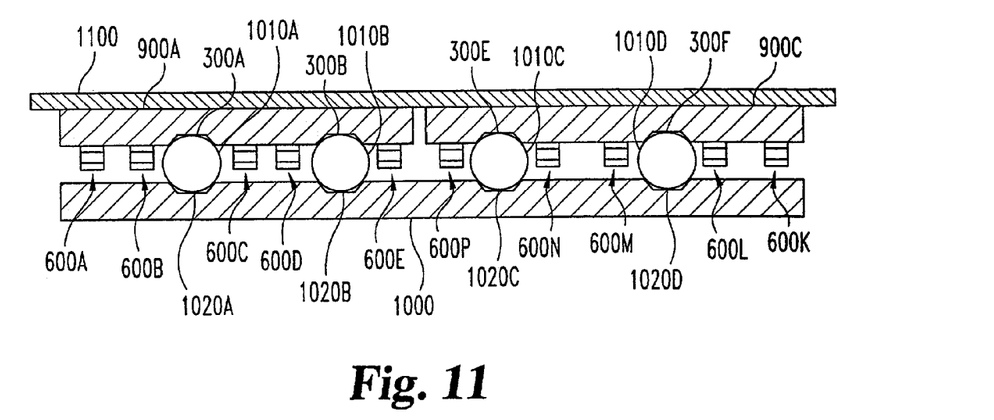
FIG. 11 is a partially cross-sectional view of a further step in the exemplary process of FIG. 1.
Figure 12:
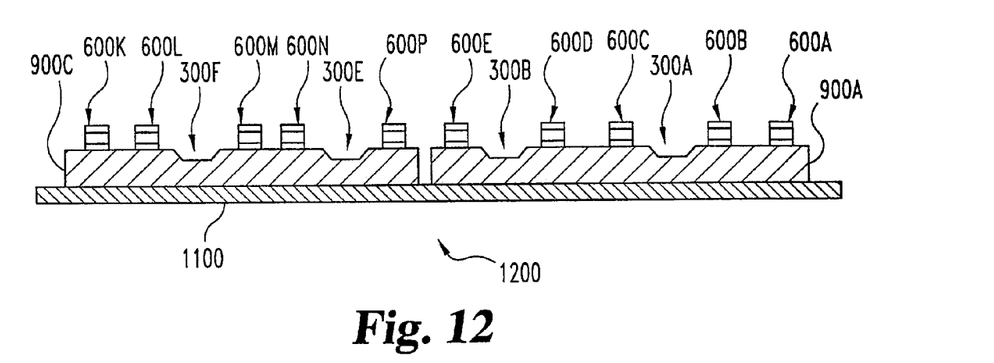
FIG. 12 is a cross-sectional view of an assembled structure according to the present invention.

As seen in FIG. 11, a backing substrate 1100 is fixed to the individual dice 900A, C elements. The substrate 1100 may be made of silicon, alumina, or any other suitable material. The backing substrate 1100 is fixed to the individual dice elements 900A, C using glue or another suitable means such as epoxy (not shown). The glue may then be cured (if necessary) and the assembled substrate 1200 as shown in FIG. 12 removed from the alignment spheres 1010A–D. The resulting assembled substrate 1200 contains a plurality (ten shown, although more or fewer are also contemplated) microstructure features 600A–E, K–P aligned with respect to one another in the X-axis, Y-axis and Z-axis directions. Because the alignment of the microstructure features 600A–E, K–P is dependent only upon the positioning of the guide pits on the individual die elements 900 A, C and the master substrate 1000 and the alignment spheres 1010A–D, variations in the backing substrate 1100 or the glue layer do not affect the final positioning of the microstructure features 600A–E, K–P.

Although the present invention was described as using guide pits and alignment spheres, the present invention also contemplates the use of alternate alignment means. For example, straight sided guide holes may be formed in the surface of the substrate using a deep reactive ion etch process. In addition to guide spheres, the present invention also contemplates the use of other suitable alignment devices such as pins or cylinders and correspondingly shaped guide groves or pits on the surface of the substrate.

Figure 13:
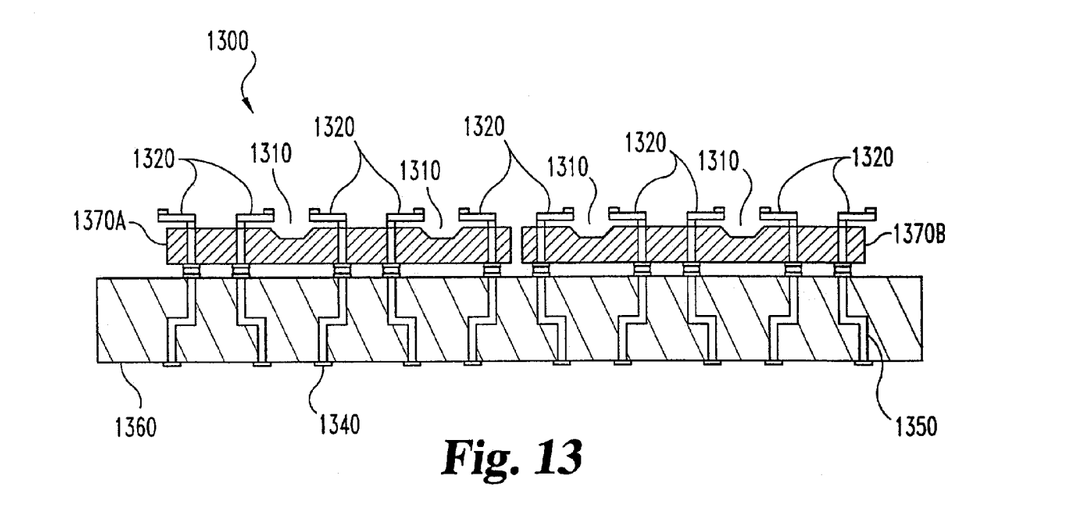
FIG. 13 is a partially cross-sectional view of a probe card according to the present invention.

The assembled substrate shown in FIG. 12 is for illustrative purposes only. Another example of an assembled substrate according to the present invention includes a probe card suitable for testing semiconductor devices as is known in the industry. FIG. 13 depicts an example of such a probe card 1300 consisting of two individual die elements 1370A–B fixed to a backing substrate 1360. Although only two die elements 1370A–B are depicted in FIG. 13, it is understood that the present invention also contemplates the fabrication of probe cards consisting of more or fewer die elements. The backing substrate 1360 as shown could consist of a space transformer such as the one described in U.S. Pat. No. 5,974,662 which is incorporated herein by reference. Alternatively, a backing substrate could be included between the individual die elements and such a space transformer.

The microstructure features formed on such a probe card 1300 are probe elements 1320 such as microspring probes previously described and suitable for engagement with contact points or bond pads on a semiconductor substrate or device. Such a probe card 1300 would also incorporate terminals 1340 for engagement with a probe head on the face of the backing substrate 1360 opposite the probe elements 1320. Wiring interconnects 1350 passing through the backing substrate 1360 would connect each probe element 1320 with a corresponding terminal 1340.

It should be noted that, although the exemplary microstructures 600A–P illustrated in FIGS. 6–12 are generally shaped as posts, the microstructures may be fashioned in many different shapes. This is accomplished by patterning openings 500A–J to form a negative (or mold) of the desire shape of the microstructure.

FIGS. 14A–D illustrate formation of microstructures that are exemplary spring contact structures. These are nonlimiting examples of spring contact structures that may be formed on substrate 100 in place of post-shaped structures 600A–P.

Figure 14A:
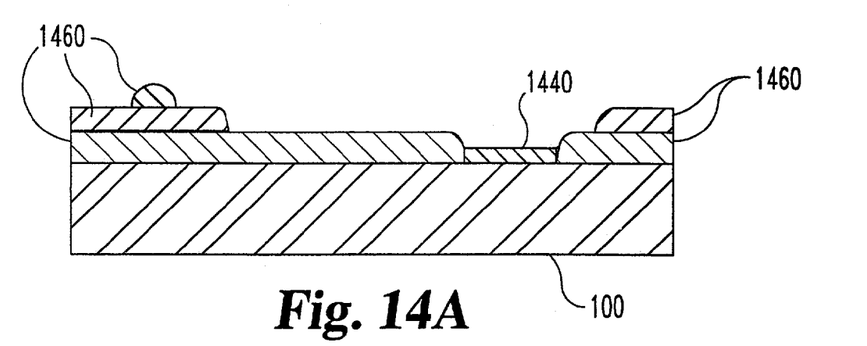
FIG. 14A is a cross-sectional view illustrating an initial step in a process showing an alternate embodiment of the present invention.
Figure 14B:
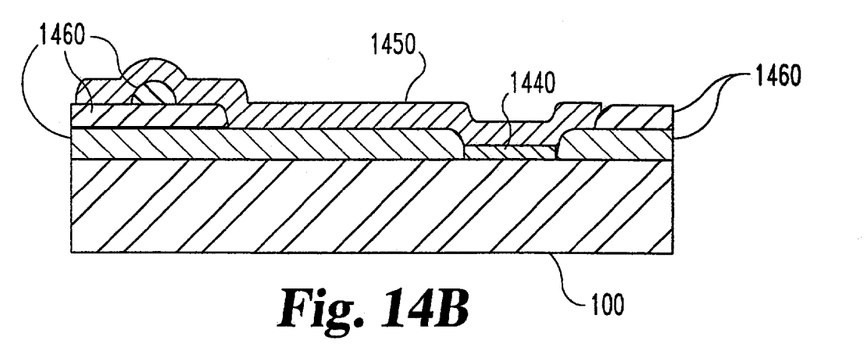
FIG. 14B is a cross-sectional view of a further step in the process of FIG. 14A.
Figure 14C:
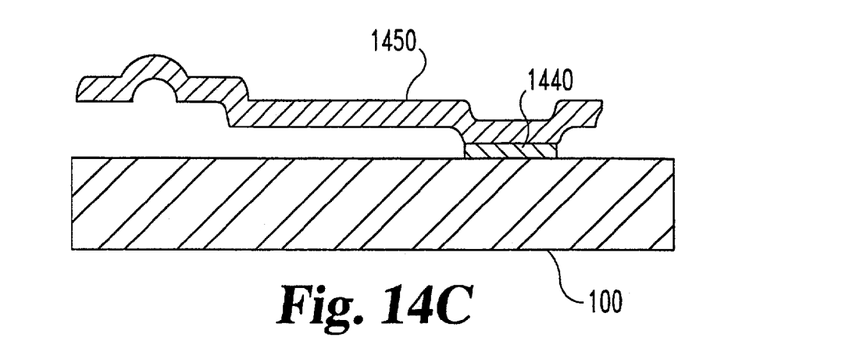
FIG. 14C is a cross-sectional view of a further step in the process of FIG. 14A.

As shown in FIG. 14A, a plurality of masking layers 1460 patterned to form a reverse molded shape for a spring contact structure are applied to substrate 100. An opening is left in the masking layers 1460 for terminal 1440. As should be apparent, these masking layers replace masking layers 410 in FIGS. 4–7. Rather than apply a plurality of masking layers as shown FIGS. 14A–C, a single masking layer could be applied and then stamped, pressed, or otherwise molded to have the desired shape. Thereafter, one or more layers of material are formed on the pattern masking layers 1460 to form a contact spring structure 1450 as shown in FIG. 14B. This may be similar to the step illustrated in FIGS. 6 and 7. The masking layers 1460 are then removed, leaving a spring contact 1450 attached to terminal 1440 on substrate 100. This may be similar to the step illustrated in FIG. 8.

Figure 15A:
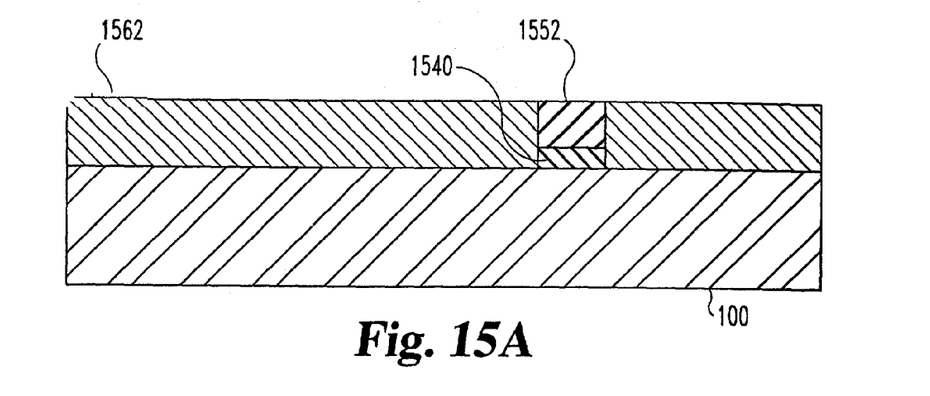
FIG. 15A is a cross-sectional view illustrating an initial step in a process showing another embodiment of the present invention.
Figure 15B:
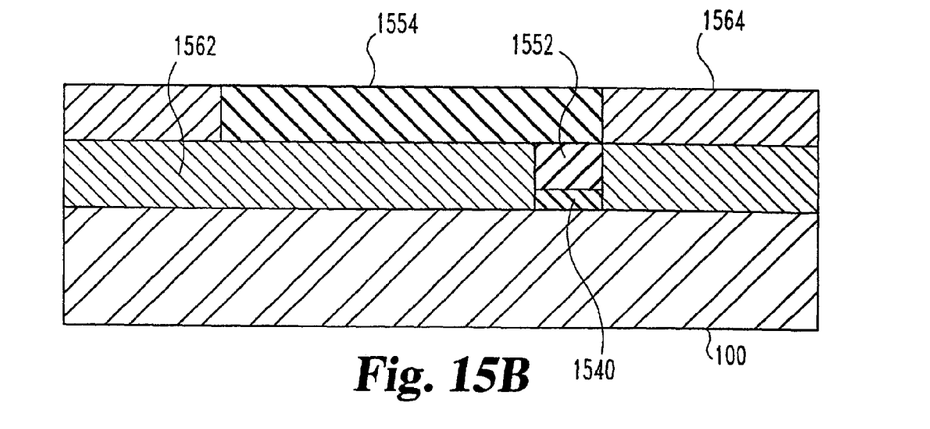
FIG. 15B is a cross-sectional view of a further step in the process of FIG. 15A.
Figure 15C:
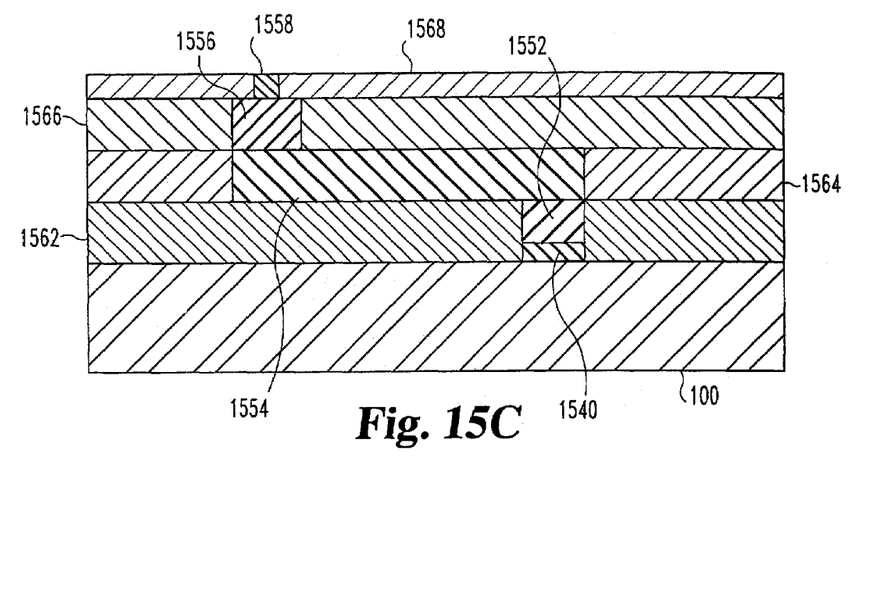
FIG. 15C is a cross-sectional view of a further step in the process of FIG. 15A.
Figure 15D:
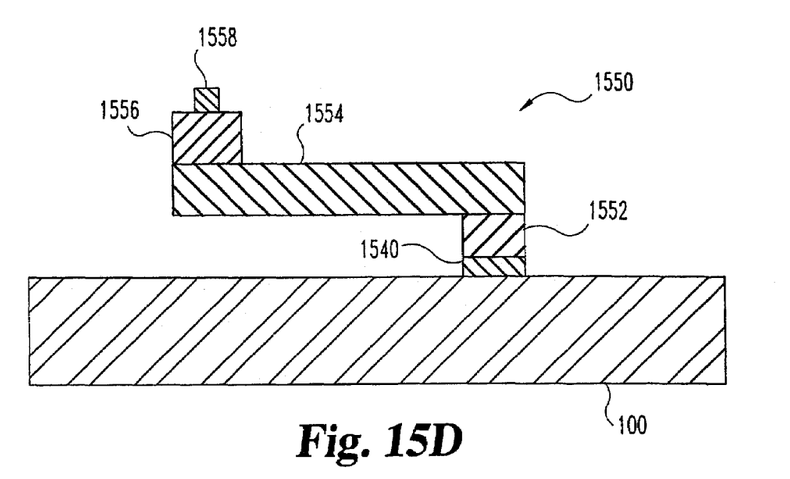
FIG. 15D is a cross-sectional view of a further step in the process of FIG. 15A.

FIGS. 15A–D illustrate another example of spring contact. In this example, distinct post 1552, beam 1554, and tip 1556, 1558 portions of the contact structure 1550 are separately created. As shown in FIG. 15A, the post 1552 is created by forming a first masking layer 1562 on substrate 100 with an opening over terminal 1540. The post portion 1552 is then formed by filling the opening with a material suitable for the post as shown in FIG. 15A. Thereafter a second masking layer 1564 is formed over the first masking layer 1562, defining an opening that includes the post 1552 and defines the beam 1554. The beam 1554 is then created by filling the opening with a material suitable for beam as shown in FIG. 15B. The process is then repeated with third and fourth masking layers 1566, 1568 defining the tip 1556, 1558 as shown in FIG. 15C. The foregoing steps would replace the step of applying masking layer 410 in FIGS. 4 and 5. Thereafter, the masking layers 1562, 1564, 1566, 1568 are removed, leaving interconnect structure 1550 attached to the terminal 1540. This step is similar to removing masking layer 410 illustrated in FIG. 8.

Figure 16A:
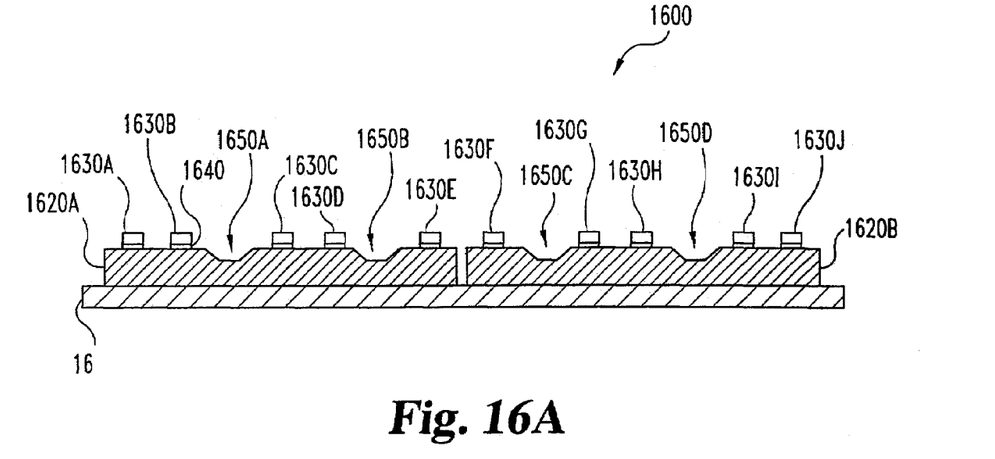
FIG. 16A is a cross-sectional view illustrating an initial step in a process showing another embodiment of the present invention.
Figure 16B:
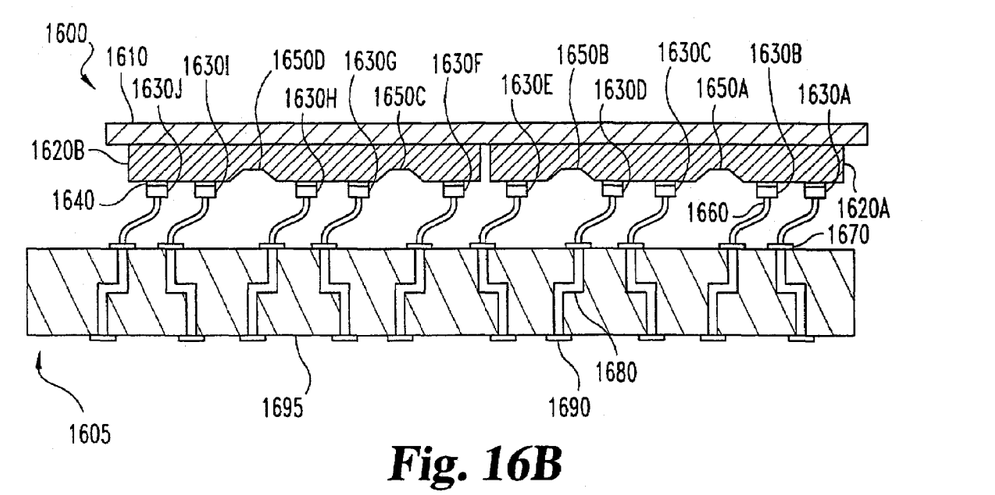
FIG. 16B is a cross-sectional view of a further step in the process of FIG. 16A.
Figure 16C:
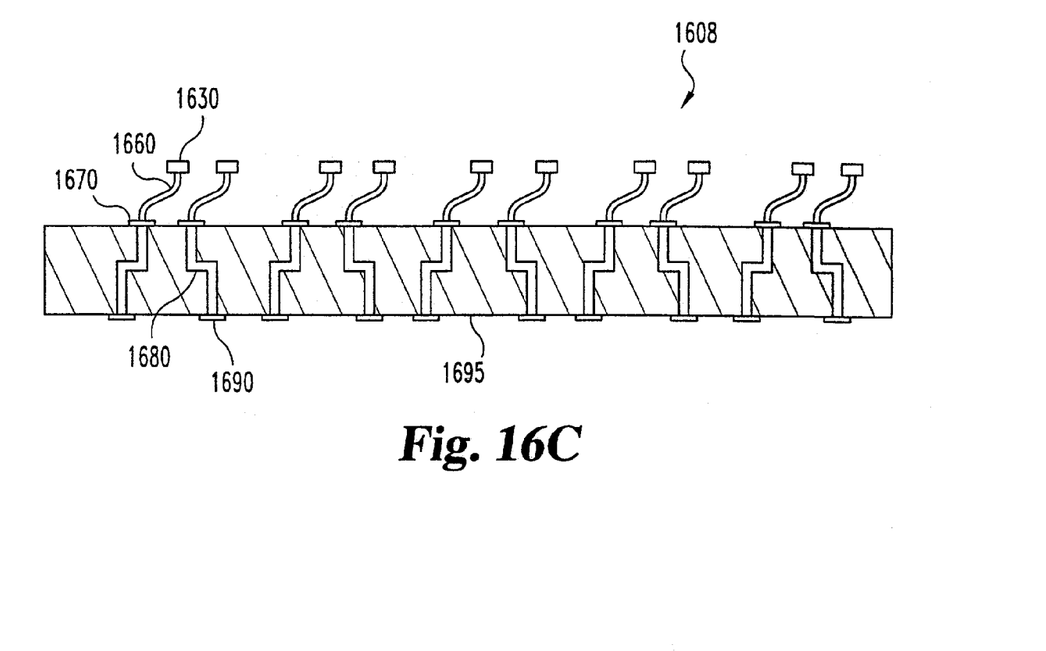
FIG. 16C is a cross-sectional view of a further step in the process of FIG. 16A.

The array of structures produced by the disclosed process need not be the final desired structure. Rather, the disclosed process may be utilized to create intermediate arrays for use in an assembly process. For example, FIGS. 16A–C shows the use of an array created according to the process described in FIGS. 1–12 to create the final desired structure. In this example, FIG. 16A shows an array 1600 of tip structures 1630A–J which may be created using the process described in FIGS. 1–12. The array 1600 comprises a plurality of individual die elements 1620 A–B (two shown, although more or fewer are also contemplated) fixed to a backing substrate 1610. Attached to the surface of each die 1620 A–B are a plurality of tip structures 1630 A–J (ten shown, although more or fewer are also contemplated). The tip structures 1630 A–J are preferably secured to the surface of the dice 1620 A–B by a layer of a suitable release material 1640 such as alumina. The use of other release materials is also contemplated.

FIG. 16B shows the array 1600 of FIG. 16A aligned with a second array of structures 1605, which may be probe elements forming a portion of a probe card suitable for testing semiconductor devices as is known in the industry. A plurality of probe elements 1660 (ten shown, although more or fewer are also contemplated) are attached to the probe bases 1670. Wiring interconnects 1680 passing through the substrate 1695 provide electrical connection between the probe elements 1660 and the corresponding terminal 1690 located on the face of the substrate 1695 opposite the probe element 1660. After being brought into contact with a corresponding probe element 1660, the individual tip structures 1630A–J may be fixed to a probe element 1660. The exact nature of the method of fixation will, of course, vary according to the composition and nature of the individual tip structures and probe elements and may include such methods as soldering, brazing, or any other suitable method. The probe elements 1660 may be any type of probe element known in the field for testing semiconductor devices. Examples of such probes include needle probes, Cobra® brand probes, and resilient spring probes. Examples of spring probes can be found in the following: U.S. Pat. No. 5,476,211; U.S. Pat. No. 5,917,707; U.S. Pat. No. 6,336,269; U.S. Pat. No. 6,268,015; U.S. patent application Ser. No. 09/710,539, filed Nov. 9, 2000; and U.S. Pat. application Ser. No. 09/746,716, filed Dec. 22, 2000, all of which are incorporated herein by reference. Alternatively, the probes 1660 may themselves have been formed using the procedures as described above with respect to FIGS. 1–12. For example, the probes may be probes 1320 shown in FIG. 13.

Once the tip structures 1630A–J are fixed to the probe elements 1660, the release layer 1640 securing the tip structures 1630A–J to the backing substrate 1610 may be removed using a process suitable to the particular release layer 1640 being used. Once the release layer 1640 is dissolved, the backing substrate 1610 and the die elements 1620A, 1620B may be removed yielding an array 1608 of probe elements 1660 with attached tip structures 1630A–J, as shown in FIG. 16C. The structure 16C illustrated in FIG. 16C may then form a portion of a probe card assembly. For example, the structure illustrated in FIG. 16C may be used as the space transformer illustrated in element 506 of FIG. 5 of U.S. Pat. No. 5,974,662, which is incorporated herein by reference.

It should be apparent that the tip structures 1630 illustrated in FIGS. 16A–16C are not limited to simple square shapes but may include more complicated shapes and structures. For example, U.S. application Ser. No. 08/819,464, filed Mar. 17,1997 (now abandoned) (which corresponds to published PCT application WO 97/43653) and U.S. application Ser. No. 09/189,761, filed Nov. 10, 1998 (which corresponds to published PCT application WO 00/28625, (both of the foregoing US applications are incorporated herein by reference) disclose examples of tip structures 1630 or other partial structures that may be formed and attached to probes or other partial structures using the principles described herein.

Figure 17:
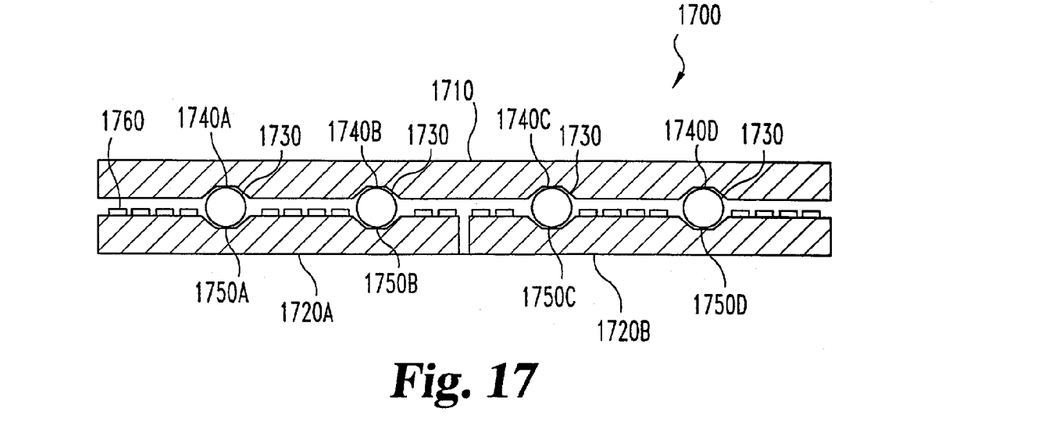
FIG. 17 is a cross-sectional view of another example of an assembled structure according to the present invention.

FIG. 17 illustrates that it is not necessary to remove the master substrate when practicing the present invention. FIG. 17 also illustrates an array 1700 in which the structures formed using the process described in FIGS. 1–12 are not probe elements or electrical contacts, but rather light emitting diodes (LEDs). Individual die elements 1720A–B (two shown, although more or fewer are also contemplated) having a plurality of LEDs (20 shown, although more or fewer are also contemplated) attached to or fabricated within their surface are formed and aligned using the process described in FIGS. 1–9. During the assembly process the dice 1720A–B are aligned by placing alignment spheres 1730 in the guide pits 1740A–D (four shown, although more or fewer are also contemplated) of the master substrate 1710 and the corresponding die pits 1750A–D (four shown, although more or fewer are also contemplated) of the dice 1720A–B. This process is similar to that previously described in FIG. 10. In this example, however, once the dice 1720A–B are aligned, the alignment spheres 1730 are fixed to the master substrate 1710 and individual dice 1720A–B. By selecting a transparent or semi-transparent substrate 1710, this process may be utilized to produce, for example, a display screen where the LEDs 1760 are visible through the master substrate 1710. Wiring to the LEDs may be through the master substrate 1710, the dice 1720A–B, or both as desired. The alignment spheres 1730 may provide electrical contact between the master substrate 1710 and the dice 1720A–B.

FIG. 17 shows one example of a structure created by using the process described in FIGS. 1–12 wherein the master substrate becomes a part of the desired array. In another example, the LED shown in FIG. 17 may be formed on the surface of the master substrate while electrical contract structures corresponding to the LEDs may be formed on the surface of the dice. In an alternate example, the LEDs may be replaced by radio frequency emitting devices to form a phased array radar. One or more individual die, as shown in FIG. 17, can be replaced as a die wears out in use or otherwise fails in use. For example, if a LED on one of the dice failed at any time, the die with the bad LED could be replaced with a new die.

It should be apparent that the post-shaped microstructures illustrated in FIGS. 6–12 and the spring contact microstructures illustrated in FIGS. 14A–15D are but three examples of types of microstructures from which an array can be fabricated using the techniques of the present invention. Other nonlimiting examples include spring structures such as those shown in the aforementioned U.S. application Ser. No. 08/802,054 filed Feb. 18, 1997 as well as U.S. application Ser. No. 09/364,855 filed Jul. 30, 1999 and U.S. Pat. No. 6,268,015, all of which are incorporated herein by reference. Non-limiting examples of structures used to probe a semiconductor wafer during testing of the wafer which may be fabricated using the techniques of the present invention include needle probes and Cobra® brand probes.

Of course, the microstructures are not limited to contacts. Other nonlimiting examples of microstructures that can be fabricated using the techniques of the present invention include arrays of micro-mirrors, arrays of micro-antennae, photosensitive regions, display pixels, and phosphor dots. Indeed, this invention is applicable to forming arrays of any type of microstructure, including without limitation any type of Microelectromechanical Systems (MEMS), and also active elements, transistors, diodes, or other circuitry.

Of course, the physical or mechanical properties of the microstructures may be manipulated by including particular additives in the materials used to form the interconnection elements and/or by heat-treating. Nonlimiting examples are described in U.S. Pat. No. 6,150,168, which is incorporated herein by reference.

While the invention has been illustrated and described in detail in the drawings and foregoing description, the same is to be considered as illustrative and not restrictive in character, it being understood that only the preferred embodiment have been shown and described and that all changes and modifications that come within the spirit of the invention are desired to be protected. The articles "a", "an", "said" and "the" are not limited to a singular element, and include one or more such element.

What is claimed is:

1. A method for constructing an array of microstructures comprising:
   providing a substrate having a plurality of substrate guide marks and a plurality of microstructures;
   separating said substrate into a plurality of dies each having microstructures and at least one of said substrate guide marks;
   providing a master substrate having a plurality of master guide marks;
   aligning alignment members with master guide marks and corresponding substrate guide marks to provide an array of dies at predetermined locations;

fixing a structural backing to said array of dies to hold said array in position at said predetermined locations; and removing said master substrate from said array of dies after said fixing the structural backing to said array of dies.

2. The method of claim 1 wherein said backing substrate includes contact terminals in electrical contact with at least one of said dies.

3. The method of claim 1 wherein said microstructures comprise microelectromechanical systems (MEMS) structures.

4. The method of claim 3 wherein said microstructures comprise spring contacts.

5. The method of claim 1 further comprising inspecting said dies and discarding defective dies.

6. The method of claim 1 further comprising electrically testing said dies and discarding defective dies.

7. The method of claim 1 wherein said microstructures comprise microelectromechanical systems (MEMS) structures.

8. The method of claim 1 where in said microstructures comprise spring contacts.

9. The method of claim 1 wherein said microstructures are tips, said method further comprising:
attaching said tips to probe elements, and
releasing said tips from said substrate.

10. The method of claim 1 wherein said substrate guide marks comprise indentations in said substrate adapted to receive generally frusto-spherical portions of an alignment member.

11. The method of claim 1 wherein said alignment members comprise spherically shaped elements.

12. The method of claim 1 wherein said master substrate comprises a plurality of dies fixed to a structural backing.

13. The method of claim 1 further comprising providing at least one electronic circuit element on said substrate.

14. The method of claim 13, wherein said at least one electronic circuit element is one of a transistor, diode, resistor, or capacitor.

15. The method of claim 13 further comprising providing a plurality of said circuit elements, wherein at least one of said electronic circuit elements is integrated into said substrate.

16. The method of claim 1, wherein said step of providing a substrate comprises forming said substrate guide marks through a patterned masking material.

17. The method of claim 16, wherein said step of providing a substrate further comprises patterning said masking material to define locations of said guide marks on said substrate.

18. The method of claim 1, wherein said step of providing a substrate comprises etching said guide marks into said substrate.

19. The method of claim 1 further comprising, after said aligning step, attaching ones of said plurality of microstructures to other structures.

20. The method of claim 19, further comprising, after said attaching step, releasing said microstructures from said substrate.

21. The method of claim 20, wherein said other structures are probes and said microstructures are probe tips.

22. The method of claim 1, wherein said guide marks comprise structural irregularities in said substrate.

23. The method of claim 22, wherein said master guide marks comprise structural irregularities in said master substrate.

24. The method of claim 23, wherein each of said alignment members mates with one of said guide marks of said substrate and one of said master guide marks of said master substrate.

25. The method of claim 1, wherein said guide marks comprise indentations in said substrate.

26. The method of claim 25, wherein said master guide marks comprise indentations in said master substrate.

27. The method of claim 26, wherein each of said alignment members mates with one of said indentations in said substrate and one of said indentations in said master substrate.

28. A method for constructing an array of microstructures comprising:
providing a substrate having a plurality of substrate guide marks and a plurality of microstructures;
separating said substrate into a plurality of dies each having microstructures and at least one of said substrate guide marks;
providing a master substrate having a plurality of master guide marks;
aligning alignment members with master guide marks and corresponding substrate guide marks to provide an array of dies at predetermined locations;
fixing a structural backing to said array of dies to hold said array of dies in position at said predetermined locations
wherein:
said microstructures comprise microelectromechanical systems (MEMS) structures,
said microstructures comprise spring contacts, and
said substrate guide marks comprise indentations in said substrate adapted to receive generally frusto-spherical portions of an alignment member.

29. The method of claim 28 wherein said alignment members comprise discreet spherically shaped elements.

* * * * *